US011595052B2

United States Patent
Li et al.

(10) Patent No.: US 11,595,052 B2
(45) Date of Patent: Feb. 28, 2023

(54) PIPELINED ANALOG-TO-DIGITAL CONVERTER AND OUTPUT CALIBRATION METHOD THEREOF

(71) Applicant: NO.24 RESEARCH INSTITUTE OF CHINA ELECTRONICS TECHNOLOGY GROUP CORPORATION, Chongqing (CN)

(72) Inventors: Ting Li, Chongqing (CN); Gangyi Hu, Chongqing (CN); Ruzhang Li, Chongqing (CN); Yong Zhang, Chongqing (CN); Dongbing Fu, Chongqing (CN); Zhengbo Huang, Chongqing (CN); Yabo Ni, Chongqing (CN); Jian'an Wang, Chongqing (CN); Guangbing Chen, Chongqing (CN)

(73) Assignee: NO.24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 17/623,613

(22) PCT Filed: Jul. 26, 2019

(86) PCT No.: PCT/CN2019/097820
§ 371 (c)(1),
(2) Date: Jun. 23, 2022

(87) PCT Pub. No.: WO2021/003776
PCT Pub. Date: Jan. 14, 2021

(65) Prior Publication Data
US 2022/0321136 A1    Oct. 6, 2022

(30) Foreign Application Priority Data

Jul. 5, 2019   (CN) .......................... 201910603268.7

(51) Int. Cl.
H03M 1/06    (2006.01)
H03M 1/10    (2006.01)

(52) U.S. Cl.
CPC ................................ H03M 1/1014 (2013.01)

(58) Field of Classification Search
CPC .... H03M 1/164; H03M 1/1004; H03M 1/167; H03M 1/0641; H03M 1/0695;
(Continued)

(56) References Cited

U.S. PATENT DOCUMENTS 6,304,204 B1 * 10/2001 Norman ................. H03M 1/069
                                                           341/161
8,791,844 B2 *  7/2014 Meacham ........... H03M 1/0673
                                                           341/161
(Continued)

FOREIGN PATENT DOCUMENTS

CN    101355363 A    1/2009
CN    102299715 A    12/2011

*Primary Examiner* — Linh V Nguyen

(57) ABSTRACT

A pipelined analog-to-digital converter and an output calibration method for the same. The pipelined analog-to-digital converter introduces an error calibration mechanism on the basis of traditional pipelined analog-to-digital converters through a control module, an equivalent gain error extraction module, an error storage module and a coding reconstruction module to compensate for gain errors and setup errors caused by operational amplifiers in a pipelined conversion module, so that the analog-to-digital conversion accuracy is improved, and requirements for the gain and bandwidth of the operational amplifier are relaxed, which can effectively reduce the power consumption of the analog-to-digital converter and the complexity of the corresponding analog circuit; a curve fitting method is adopted to obtain an ideal output sequence and then calculate errors; meanwhile, extraction and calibration of equivalent gain errors are all done in digital ways, and therefore accuracy thereof is high.

13 Claims, 2 Drawing Sheets

(58) Field of Classification Search
CPC ............. H03M 1/1028; H03M 1/1033; H03M 1/0687; H03M 1/1009; H03M 1/1061; H03M 1/121; H03M 1/1215; H03M 1/145; H03M 1/168; H03M 1/44; H03M 1/00; H03M 1/002; H03M 1/04; H03M 1/0604; H03M 1/0609; H03M 1/0634; H03M 1/0639; H03M 1/0673; H03M 1/068; H03M 1/1023; H03M 1/1038; H03M 1/1057; H03M 1/1071; H03M 1/12; H03M 1/124; H03M 1/16; H03M 1/361; H03M 1/365
USPC .................. 341/118–121, 155, 161, 162
See application file for complete search history.

(56) References Cited

U.S. PATENT DOCUMENTS

| | | | |
|---|---|---|---|
| 8,836,558 B1* | 9/2014 | Ali | H03M 1/1071 341/120 |
| 10,103,742 B1* | 10/2018 | Guo | H03M 1/145 |
| 10,103,753 B1 | 10/2018 | Nagarajan et al. | |
| 10,735,014 B2* | 8/2020 | Pu | H03M 1/0634 |
| 2002/0014982 A1* | 2/2002 | Jonsson | H03M 1/1057 341/120 |
| 2002/0175843 A1* | 11/2002 | Sonkusale | H03M 1/1004 341/120 |
| 2005/0200512 A1* | 9/2005 | Tani | H03M 1/08 341/155 |
| 2008/0198055 A1* | 8/2008 | Matsubayashi | H03M 1/068 341/155 |
| 2011/0279295 A1* | 11/2011 | Li | H03M 1/0695 341/110 |
| 2015/0381192 A1* | 12/2015 | Yamamoto | H03M 1/1038 341/120 |
| 2019/0131992 A1* | 5/2019 | Ali | H03M 1/0687 |
| 2019/0280703 A1* | 9/2019 | Naru | H03M 1/0604 |

* cited by examiner

PIPELINED ANALOG-TO-DIGITAL CONVERTER AND OUTPUT CALIBRATION METHOD THEREOF

FIELD OF TECHNOLOGY

The present disclosure generally relates to analog-to-digital conversion technology and in particular to a pipelined analog-to-digital converter and an output calibration method thereof.

BACKGROUND

An analog-to-digital converter is an electronic component that transforms analog signals into digital signals through certain circuits. Modern complete computer systems have higher and higher requirements on analog-to-digital converters, including high speed, high precision, low power consumption, etc.

Traditional analog-to-digital converters, while achieving high speed and high accuracy, usually lead to higher power consumption.

In view of this, there is an urgent need for a new technical means to obtain analog-to-digital converters with high speed, high precision, and low power consumption.

SUMMARY

The present disclosure provides a pipelined analog-to-digital converter, including: a pipelined conversion module, a control module, an equivalent gain error extraction module, an error storage module, and a coding reconstruction module.

The pipelined conversion module includes a plurality of pipelined conversion stages, the last stage of the plurality of pipelined conversion stages includes a flash analog-to-digital converter, and each of the remaining stages of the plurality of pipelined conversion stages includes a flash analog-to-digital converter and a multiplicative digital-to-analog converter; in a test mode, the control module selectively configures the plurality of pipelined conversion stages in the pipelined conversion module to obtain an analog-to-digital converted test output sequence, the equivalent gain error extraction module fits the test output sequence to obtain an ideal reference signal, calculates equivalent gain errors from the last stage to the first stage of the plurality of pipelined conversion stages according to a difference between the test output sequence and the ideal reference signal, and stores the calculated equivalent gain errors in the error storage module, where each of the equivalent gain errors corresponds to a stage of the plurality of pipelined conversion stages; in an operation mode, the coding reconstruction module calculates calibrated output based on an actual output sequence of the pipelined conversion module and the equivalent gain errors stored in the error storage module.

Optionally, each flash analog-to-digital converter includes a plurality of comparators connected in parallel, by means of which an input analog signal is quantized and converted into a digital signal to obtain a corresponding output code, and in stages other than the last stage, a corresponding multiplicative digital-to-analog converter first performs digital-to-analog conversion of the output code to obtain a corresponding converted analog signal, and calculates and amplifies the difference between the input analog signal and the converted analog signal to obtain a residual, where the residual serves as an input analog signal for the next stage.

Optionally, each multiplicative digital-to-analog converter includes an operational amplifier, where at least one of the operational amplifiers in the pipelined conversion module has a gain or bandwidth lower than that of the other operational amplifiers, so that power consumption of the pipelined analog-to-digital converter can be lowered.

Optionally, in the test mode, the control module, when selectively configuring the plurality of pipelined conversion stages in the pipelined conversion module, first determines the number of stages whose equivalent gain errors require calibration, and then correspondingly set a threshold value for each comparator in each stage of the plurality of pipelined conversion stages in the test mode, where each equivalent gain error includes a gain error and a setup error.

Optionally, when calculating the equivalent gain error of a stage i of the pipelined conversion stages, absolute values of threshold values for comparators in stages $1, 2, \ldots,$ and $i-1$ of the pipelined conversion stages are greater than or equal to $Fs/(2G)$, where Fs is a full amplitude range of the input analog signal corresponding to the stage i, and G is an inter-stage gain of the pipelined conversion stages.

The present disclosure further provides an output calibration method for a pipelined analog-to-digital converter including:

determining the number of stages whose equivalent gain errors require calibration, where the stages are chosen from a plurality of pipelined conversion stages in the pipelined analog-to-digital converter, where each stage has a corresponding equivalent gain error, and setting a comparator interval for each stage of the plurality of pipelined conversion stages, where each equivalent gain error includes a gain error and a setup error;

inputting a test analog signal to the pipelined analog-to-digital converter to obtain a test output sequence;

fitting the test output sequence to obtain a fitted curve as an ideal output sequence;

calculating the equivalent gain error of each stage of the pipelined conversion stages based on the test output sequence and the ideal output sequence;

inputting an actual analog signal to the pipelined analog-to-digital converter to obtain an actual output sequence; and performing coding reconstruction based on the actual output sequence and the equivalent gain error of each stage of the pipelined conversion stages to obtain a calibrated output.

Optionally, at least one of the operational amplifiers in the pipelined conversion module has a gain or bandwidth lower than that of the other operational amplifiers, so that power consumption of the pipelined analog-to-digital converter can be lowered.

Optionally, when calculating the equivalent gain error of a stage i of the pipelined conversion stages, absolute values of threshold values for comparators in stages $1, 2, \ldots,$ and $i-1$ of the pipelined conversion stages in a testing mode are greater than or equal to $Fs/(2G)$, where Fs is a full amplitude range of the input analog signal corresponding to the stage i, and G is an inter-stage gain of the pipelined conversion stages.

Optionally, when calculating the equivalent gain error of a stage i of the pipelined conversion stages, the test analog signal is a signal with pre-recorded characteristics, whose amplitude is close to but does not exceed $Fs/[G^{(i-1)}]$, where $Fs=(Vref+)-(Vref-)$, where Vref+ is a first reference voltage of multiplicative digital-to-analog converters in the pipelined conversion stages, and Vref− is a second reference voltage of the multiplicative digital-to-analog converters in the pipelined conversion stages.

Optionally, the test analog signal has at least one monotonically varying interval, the width of the interval is greater than or equal to Fs/G, where Fs is a full amplitude range of the test analog signal and G is an inter-stage gain of the pipelined conversion stages.

Optionally, the method further includes performing curve fitting on the test output sequence based on the characteristics of the test analog signal to obtain the fitted curve.

Optionally, the step of calculating the equivalent gain error of each stage of the pipelined conversion stages based on the test output sequence and the ideal output sequence includes:

subtracting the corresponding ideal output sequence from the test output sequence to obtain an error sequence;

from higher stages to lower stages, and starting from the last stage of the pipelined conversion stages that requires calibration, sequentially calculating and extracting the equivalent gain error of each stage.

Optionally, the error sequence is segmented according to the comparator interval of the pipelined conversion stages, and when calculating the equivalent gain error of the stage i of the pipelined conversion stages, a plurality of segments of the error sequence is first chosen, then an equivalent gain error of each of the segments is extracted first, and then the equivalent gain errors of the segments are averaged to obtain the equivalent gain error of the stage i of the pipelined conversion stages, where i=1, 2, . . . , n, n is the number of stages in the pipelined conversion stages whose equivalent gain errors require calibration, and n is a positive integer.

Optionally, the equivalent gain error of each segment of the error sequence is given by:

$$\varepsilon_{i\_j} = \frac{\text{Max}(Err_{i\_j}) - \text{Min}(Err_{i\_j})}{Vthcomp}$$

$$\varepsilon_i = \frac{1}{k}\sum_{j=1}^{k}\varepsilon_{i\_j}$$

where $\varepsilon_{i\_j}$ is the equivalent gain error of a j-th segment of the error sequence in the stage i of the pipelined conversion stages, $\text{Max}(Err_{i\_j})$ is the maximum value of the a j-th segment of the error sequence of the stage i of the pipelined conversion stages, $\text{Min}(Err_{i\_j})$ is the minimum value of the jth segment of the error sequence of the stage i of the pipelined conversion stages, Vthcomp is the width of the comparator interval corresponding to the chosen segments of the error sequence of the stage i of the pipelined conversion stages, which is equal to the difference between threshold voltages of two adjacent comparators in the stage i of the pipelined conversion stages.

Optionally, an equation utilized for coding reconstruction based on the actual output sequence and the equivalent gain error of each stage of the pipelined conversion stages is given by:

$$Vout_{cali} = D_1 + D_2(1+\varepsilon_1) + D_3\prod_{i=1}^{2}(1+\varepsilon_i) + \\ \ldots + D_n\prod_{i=1}^{n-1}(1+\varepsilon_i) + [D_{n+1} + D_{n+2} + \ldots + D_N]\prod_{i=1}^{n}(1+\varepsilon_i),$$

where $Vout_{cali}$ is the calibrated digital output signal, $D_i$ (i=1, 2, . . . , N) is the product of the actual output code of the stage i and a corresponding ideal weight, N is the number of stages of the pipelined conversion stages of the pipelined analog-to-digital converter, n is the number of stages of the pipelined conversion stage whose equivalent gain errors required calibration, and $\varepsilon_i$ is the equivalent gain error of the stage i of the pipelined conversion stages.

As described above, the present disclosure has the following advantages:

1. By introducing a calibration mechanism for the equivalent gain errors through the equivalent gain error extraction module, the error storage module and the coding reconstruction module, analog-to-digital conversion accuracy of the converter is improved;

2. The equivalent gain errors of the pipelined analog-to-digital converter mainly come from the inter-stage gain error caused by the insufficient gain of operational amplifiers and the setup error caused by insufficient bandwidth of operational amplifiers; therefore, by introducing the calibration mechanism for the equivalent gain errors to improve the analog-to-digital conversion accuracy, the technical solution of the pipelined analog-to-digital converter has a high tolerance to the gain and bandwidth of operational amplifiers, and has lower requirements for the same, which can effectively reduce power consumption and reduce the design complexity of corresponding analog circuits;

3. The pipelined analog-to-digital converter technology uses curve fitting to obtain the ideal output sequence and then calculate the error, which can smooth out the effect of noise and has a high tolerance for noise.

4. The extraction and calibration of equivalent gain errors are all done in digital ways, and therefore accuracy thereof is high, which further improves the accuracy of analog-to-digital conversion of the converter.

REFERENCE NUMERALS

S1[k] k-th switch in a first switch group
S2[k] k-th switch in a second switch group
S3[k] k-th switch in a third switch group
S4 Fourth switch
S5 Fifth switch
S6 Sixth switch
Cs Sampling capacitor
Cd Conversion capacitor
Cf Feedback capacitor
Cp Parasitic capacitor
Amp Operational amplifier
Vref+ First reference voltage
Vref− Second reference voltage
Vin Input analog signal
Vres Output analog signal of each stage

DETAILED DESCRIPTION

The following describes the implementation of the present disclosure through specific examples, and those skilled in the art can easily understand other advantages and effects of the present disclosure from the content disclosed in this specification.

The present disclosure can also be implemented or applied through other different specific embodiments. Various details in this specification can also be modified or changed based on different viewpoints and applications without departing from the spirit of the present disclosure.

Figure 1:
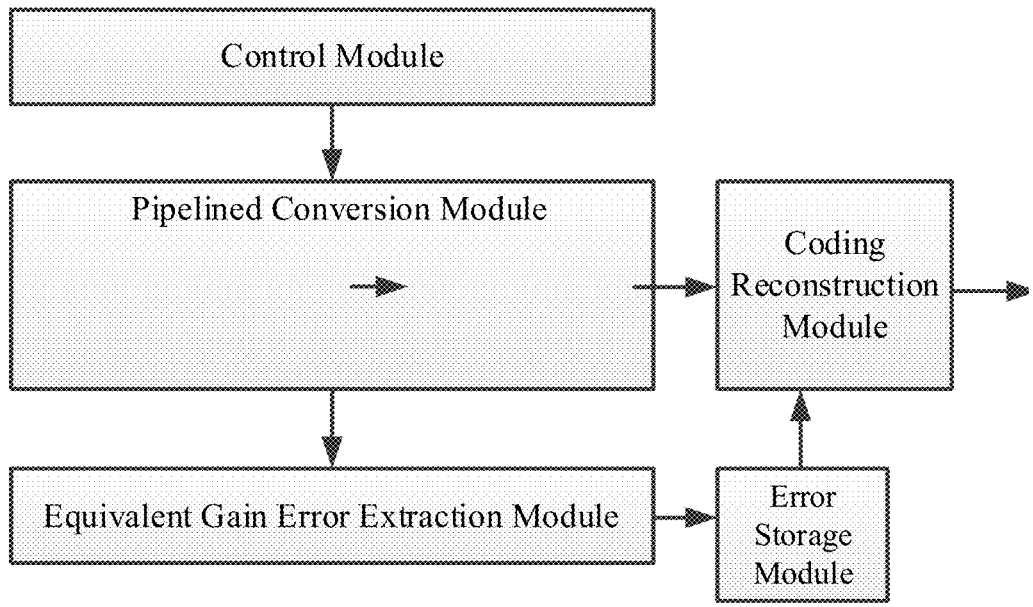
FIG. 1 is a schematic structural diagram of an analog-to-digital converter in an embodiment of the present disclosure.
Figure 2:
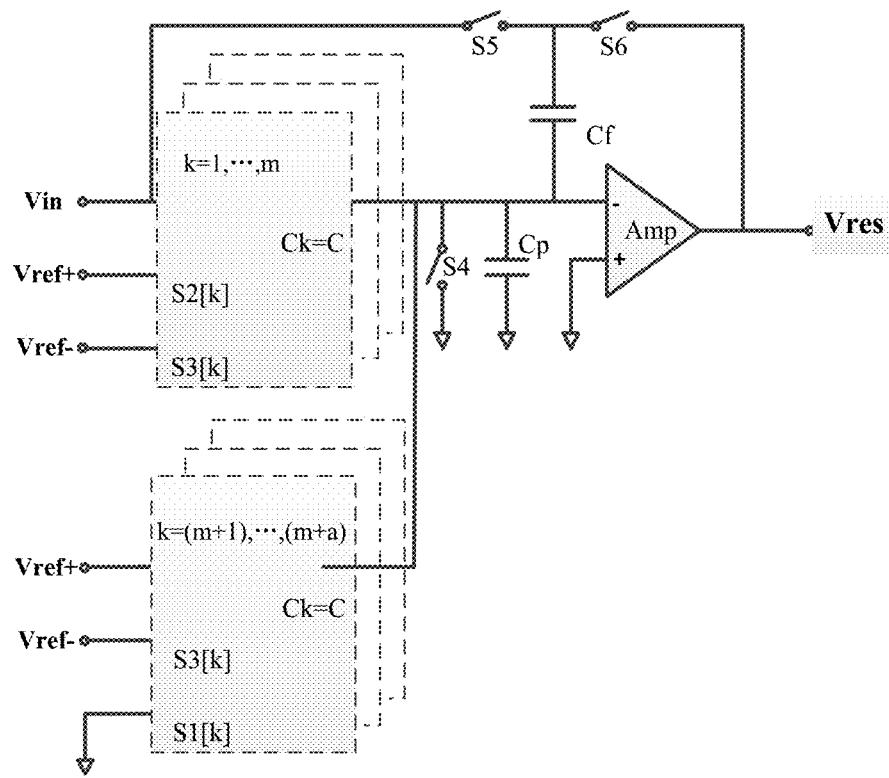
FIG. 2 is a schematic structural diagram of a multiplicative digital-to-analog converter in each stage of a pipelined analog-to-digital converter of an embodiment of the present disclosure.
Figure 3:
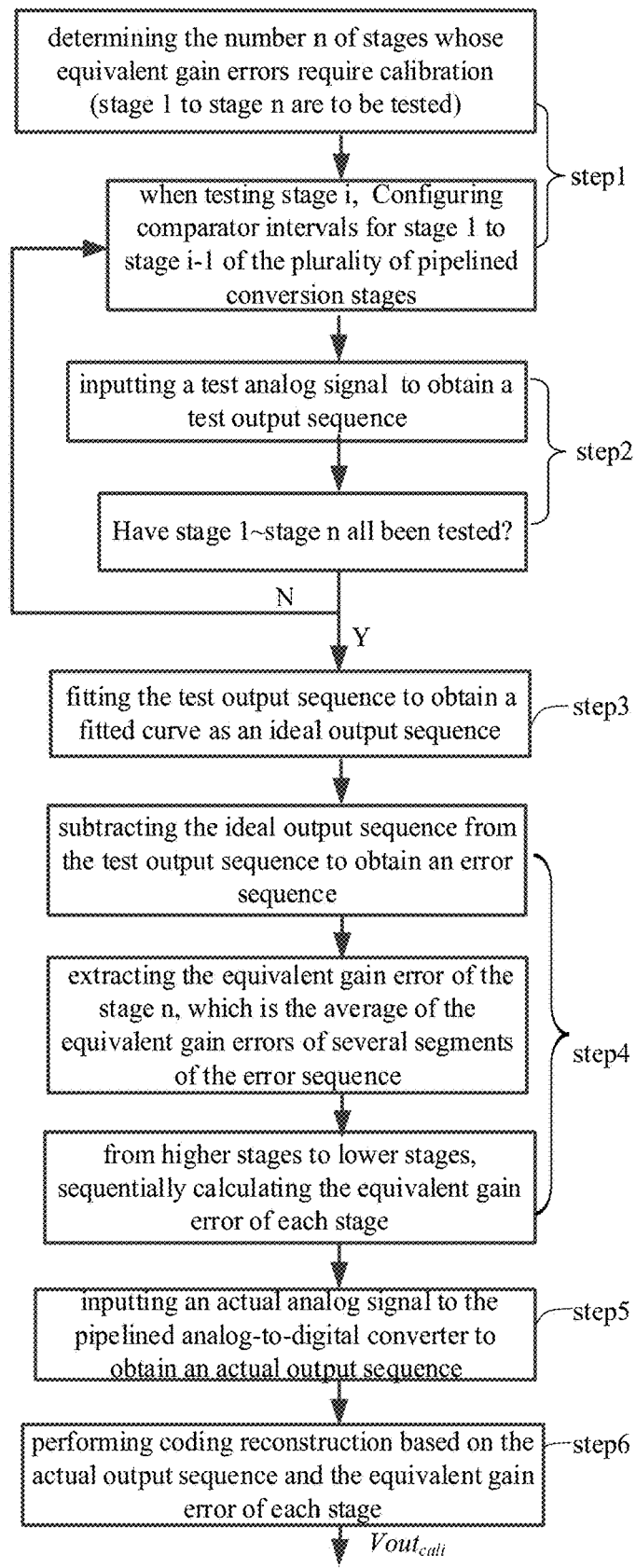
FIG. 3 is a flowchart illustrating an output calibration method of a pipelined analog-to-digital converter of an embodiment of the present disclosure.

Please refer to FIG. 1~FIG. 3.

It should be noted that the drawings provided in this disclosure only illustrate the basic concept of the present disclosure in a schematic way, so the drawings only show the components related to the present disclosure. The drawings are not necessarily drawn according to the number, shape and size of the components in actual implementation; during the actual implementation, the type, quantity and proportion of each component can be changed as needed, and the components' layout can also be more complicated.

It should be noted that the structure, ratio, size, etc. shown in the accompanying drawings in this specification are only used to illustrate the content disclosed in the specification for the understanding and reading of those familiar with this technology, and are not intended to limit the implementation of the present invention. Any structural modification, proportional relationship change or size adjustment should still fall within the scope of the present disclosure, given that no effect and objective achievable by the present disclosure are hindered.

FIG. 1 shows a schematic diagram of the structure of an analog-to-digital converter of an embodiment of the present disclosure, see FIG. 1. The present disclosure provides a pipelined analog-to-digital converter, including: a pipelined conversion module, a control module, an equivalent gain error extraction module, an error storage module, and a coding reconstruction module;

the pipelined conversion module includes a plurality of pipelined conversion stages (stage i, i=1, 2, ..., N), the last stage of the plurality of pipelined conversion stages (stage N) includes a flash analog-to-digital converter (flash ADC), and each of the rest stages (stage 1, stage 2, ..., stage N−1) of the plurality of pipelined conversion stages includes a flash ADC and a multiplicative digital-to-analog converter (MDAC);

in a test mode, the control module selectively configures the plurality of pipelined conversion stages in the pipelined conversion module to obtain an analog-to-digital converted test output sequence, the equivalent gain error extraction module fits the test output sequence to obtain an ideal reference signal, calculates equivalent gain errors from the last stage to the first stage of the plurality of pipelined conversion stages according to a difference between the test output sequence and the ideal reference signal, and stores the calculated equivalent gain errors in the error storage module, where each of the equivalent gain errors corresponds to a stage of the plurality of pipelined conversion stages;

in an operation mode, the coding reconstruction module calculates calibrated output based on an actual output sequence of the pipelined conversion module and the equivalent gain errors stored in the error storage module.

In detail, in the pipelined conversion module, the flash ADC includes a plurality of comparators connected in parallel, by means of which an input analog signal is quantized and converted into a digital signal to obtain a corresponding output code; and in stages other than the last stage, an MDAC first performs digital-to-analog conversion of the output code to obtain a corresponding converted analog signal, and calculates and amplifies the difference between the input analog signal and the converted analog signal to obtain a residual (i.e., the output analog signal of each stage of the plurality of pipelined conversion stages), where the residual serves as an input analog signal for the next stage.

FIG. 2 shows a schematic diagram of the structure of an MDAC in the pipelined conversion stages of an embodiment of the present disclosure; as shown in FIG. 2, the MDAC is of a switched-capacitor circuit structure, which contains a sampling capacitor Cs, a conversion capacitor Cd, a feedback capacitor Cf, a parasitic capacitor Cp, an operational amplifier Amp, a first switch group, a second switch group, a third switch group, a fourth switch S4, a fifth switch S5, and a sixth switch S6.

The sampling capacitor Cs consists of m unit capacitors connected in parallel (C1, C2, ..., Cm, whose capacitance values are all C), and Cs=C*m; the conversion capacitor Cd consists of a unit capacitors connected in parallel (Cm+1, Cm+2, ..., Cm+a, whose capacitance values are all C), and Cd=C*a; correspondingly, the first switch group includes (m+a) switches (S1[1], S1[2], ..., S1[m], S1[m+1], ..., S1[m+a]), the second switch group includes (m+a) switches (S2[1], S2[2], ..., S2[m], S2[m+1], ..., S2[m+a]), the third switch group contains (m+a) switches (S3[1], S3[2], ..., S3[m], S3[m+1], ..., S3[m+a]).

For each of the unit capacitors Ck (k=1, 2, ..., m, m+1, m+a) that makes up the sampling capacitor Cs and the conversion capacitor Cd, one end is connected to the input analog signal Vin or grounded through switch S1[k], connected to the first reference voltage Vref+ through switch S2[k], and connected to the second reference voltage Vref− through switch S3[k], and the other end is connected to an inverting input of an operational amplifier Amp, where the control terminal of switch S2[k] and the control terminal of switch S3[k] are simultaneously controlled by the output of a corresponding k-th comparator in the flash ADC, where S2[k] is on and S3[k] is off when the output of the k-th comparator is high, and S2[k] is off and S3[k] is on when the output is 0; the fourth switch S4 is grounded at one end and connected to the inverting input of the operational amplifier Amp at the other end; the parasitic capacitor Cp is grounded at one end and connected to the inverting input of the operational amplifier Amp at the other end; one end of the feedback capacitor Cf is connected to the inverting input of the operational amplifier Amp, the other end of the feedback capacitor Cf is connected to the input signal Vin through the fifth switch S5, and to the output of the operational amplifier Amp through the sixth switch S6; the non-inverting input of the operational amplifier Amp is grounded; and the output of the operational amplifier Amp is the output analog signal Vres of each stage of the pipelined conversion stages.

Specifically, the multiplicative digital-to-analog converter as shown in FIG. 2 operates as follows: in a sampling phase, the first switch group, the fourth switch S4 and the fifth switch S5 are on, the second switch group, the third switch group, and the sixth switch S6 are off, and the input analog signal Vin is sampled through the sampling capacitor Cs and the feedback capacitor Cf, and both ends of the conversion capacitor Cd are grounded through switches; in a feedback phase, the first switch group, the fourth switch S4 and the fifth switch S5 are off, the sixth switch S6 is on, and among the unit capacitors Ck (k=1, 2, ..., m, m+1, ..., m+a) that make up the sampling capacitor Cs and the conversion capacitor Cd, only one of switch S2[k] and switch S3[k] is on, an output code of the flash ADC is digitally converted and subtracted from the input analog signal Vin to obtain the difference between the two, and the difference between the two is amplified and output to obtain the residual Vres (i.e., the output analog signal of each pipelined conversion stage).

As previously mentioned in the background, conventional analog-to-digital converters usually result in higher power consumption when achieving high speed and high accuracy. To save power consumption, operational amplifiers with slightly lower gain or bandwidth are adopted in the analog-to-digital converter. Insufficient gain of the operational amplifiers will cause gain errors between pipelined conversion stages, while insufficient bandwidth of the operational amplifiers will cause setup errors, so that for each stage of the pipelined conversion stages, the relationship between the actual output analog signal Vres and the ideal output analog signal Vres_ideal is given by:

$$V_{res} = \frac{V_{res\_ideal}}{1+\frac{1}{Af}}\left(1-e^{-\frac{t}{\tau}}\right) = V_{res\_ideal}\left(1-\frac{1}{Af}-e^{-\frac{t}{\tau}}\right)$$

$$\text{That is } \frac{V_{res}}{V_{res\_ideal}} = 1-\frac{1}{Af}-e^{-\frac{t}{\tau}}.$$

where $$f = \frac{Cf}{Cs+Cd+Cf+Cp}, \frac{1}{Af}$$

is the gain error, $$e^{-\frac{t}{\tau}}$$

is the setup error, $$\varepsilon = \frac{1}{Af} + e^{-\frac{t}{\tau}}$$

is defined as the equivalent gain error, f is a feedback coefficient of operational amplifier Amp, A is the gain of the corresponding operational amplifier (Amp), t is a build-up time assigned to the Amp, and τ is the time constant of the Amp.

In light of this, the present disclosure proposes a new analog-to-digital converter that adopts an error calibration mechanism and improves upon traditional pipelined analog-to-digital converters through the control module, the equivalent gain error extraction module, the error storage module and the coding reconstruction module to compensate for gain errors and setup errors caused by operational amplifiers in the pipelined conversion module. As a result, the accuracy of the analog-to-digital converter is improved, and the requirements of gain and bandwidth of the operational amplifier are relaxed, which can reduce the power consumption of the analog-to-digital converter.

Based on the structure of the above mentioned analog-to-digital converter, as shown in FIG. 3, an output calibration method of the pipelined analog-to-digital converter provided by the present disclosure includes the following steps:

Step1, determining the number of stages in the pipelined conversion stages whose equivalent gain errors require calibration in the pipelined analog-to-digital converter, and setting the threshold value of the comparator of each stage of the pipelined conversion stages in the test mode.

Step2, inputting a test analog signal to the pipelined analog-to-digital converter to obtain a test output sequence.

Step3, fitting the test output sequence to obtain a fitted curve as an ideal output sequence.

Step4, calculating the equivalent gain error of each stage of the pipelined conversion stages based on the test output sequence and the ideal output sequence.

Step5, inputting an actual analog signal to the pipelined analog-to-digital converter to obtain an actual output sequence; and Step6, performing coding reconstruction based on the actual output sequence and the equivalent gain error of each stage of the pipelined conversion stages to obtain a calibrated output.

First, step 1 is executed: in the test mode, the control module selectively configures a number of stages of the pipelined conversion stages in the pipelined conversion module, determines the number of stages n of pipelined conversion stages for which equivalent gain error calibration is required, n being a positive integer, and then correspondingly sets a threshold value for the comparators of each stage of the pipelined conversion stages in the test mode.

Each equivalent gain error includes a gain error and a setup error.

Optionally, in the pipelined analog-to-digital converter, at least one operational amplifier Amp has a relatively low gain or bandwidth to reduce the power consumption of the pipelined analog-to-digital converter.

In detail, in step1, when calculating the equivalent gain error of a stage i of the pipelined conversion stages, absolute values of threshold values for comparators in stages 1, 2, . . . , and i−1 of the pipelined conversion stages are set by the control module in a testing mode to be greater than or equal to Fs/(2G), where Fs is a full amplitude range of the input analog signal corresponding to the stage i, and G is an inter-stage gain of the pipelined conversion stages.

Next, step 2 is executed: in the test mode, the control module inputs a test analog signal to the pipelined analog-to-digital converter to obtain a test output sequence.

In detail, in step 2, when calculating the equivalent gain error of a stage i of the pipelined conversion stages, the test analog signal is a signal with pre-recorded characteristics (such as a ramp signal, sinusoidal signal, etc.), whose amplitude is close to but does not exceed Fs/[G^(i−1)], where Fs=(Vref+)−(Vref−), where Vref+ is a first reference voltage of multiplicative digital-to-analog converters in the pipelined conversion stages, and Vref− is a second reference voltage of the multiplicative digital-to-analog converters in the pipelined conversion stages.

Meanwhile, in step 2, the test analog signal has at least one monotonically varying interval, the width of the interval is greater than or equal to Fs/G, where Fs is a full amplitude range of the test analog signal and G is an inter-stage gain of the pipelined conversion stages.

In addition, in step 2, the 1st, 2nd, . . . , and n-th stage of the pipelined conversion stages that need to be calibrated for equivalent gain error calibration are all tested (e.g., in sequence) before the method proceeds to the next step.

Then, Step 3 is executed: the test output sequence is fitted in the test mode to obtain the fitted curve, which serves as the ideal output sequence.

In detail, in step 3, the equivalent gain error extraction module performs curve fitting on the test output sequence based on the characteristics of the test analog signal to obtain the fitted curve.

Step 3 adopts curve fitting to obtain the ideal output sequence which can smooth out the effect of noise and helps to obtain a high tolerance for noise.

Next, Step 4 is executed: the equivalent gain error extraction module calculates the equivalent gain error of each stage of the pipelined conversion stages based on the test output sequence and the ideal output sequence and sends the calculated equivalent gain errors to the error storage module for storage.

In detail, the Step 4 of calculating the equivalent gain error of each stage of the pipelined conversion stages based on the test output sequence and the ideal output sequence includes:

Step 41, subtracting the corresponding ideal output sequence from the test output sequence to obtain an error sequence;

Step 42, from higher stages to lower stages, and starting from the last stage of the pipelined conversion stages that requires calibration (i.e., the stage n), sequentially calculating and extracting the equivalent gain error of each stage.

In more detail, the error sequence obtained in Step 41 is distinctly segmented according to the comparator (threshold) interval of the pipelined conversion stages; in Step 42, when calculating the equivalent gain error of the stage i of the pipelined conversion stages, a plurality of segments of the error sequence are first chosen, then an equivalent gain error of each of the plurality of segments is extracted first, and then the equivalent gain errors of the plurality of segments are averaged to obtain the equivalent gain error of the stage i of the pipelined conversion stages, where i=1, 2, . . . , n.

The equivalent gain error of each segment of the error sequence is given by:

$$\varepsilon_{i\_j} = \frac{\text{Max}(Err_{i\_j}) - \text{Min}(Err_{i\_j})}{Vthcomp}$$

$$\varepsilon_i = \frac{1}{k}\sum_{j=1}^{k}\varepsilon_{i\_j}$$

where $\varepsilon_{i\_j}$ is the equivalent gain error of j-th segment of the error sequence in the stage i of the pipelined conversion stages, $\text{Max}(Err_{i\_j})$ is the maximum value of the j-th segment of the error sequence of the stage i of the pipelined conversion stages, $\text{Min}(Err_{i\_j})$ is the minimum value of the j-th segment of the error sequence of the stage i of the pipelined conversion stages, Vthcomp is the width of the comparator interval corresponding to the chosen segments of the error sequence of the stage i of the pipelined conversion stages, which is equal to the difference between threshold voltages of two adjacent comparators in the stage i of the pipelined conversion stages.

Finally, Step 5 and step 6 are executed:

in an operation mode, the control module inputs an actual analog signal to the pipelined analog-to-digital converter to obtain an actual output sequence;

the coding reconstruction module performs coding reconstruction based on the actual output sequence obtained by the pipelined conversion module and the equivalent gain error of each stage of the pipelined conversion stages stored in the error storage module to obtain a calibrated output $Vout_{cali}$.

In detail, an equation utilized for coding reconstruction based on the actual output sequence and the equivalent gain error of each stage of the pipelined conversion stages is given by:

$$Vout_{cali} = D_1 + D_2(1+\varepsilon_1) + D_3\prod_{i=1}^{2}(1+\varepsilon_i) + \ldots + D_n\prod_{i=1}^{n-1}(1+\varepsilon_i) + [D_{n+1} + D_{n+2} + \ldots + D_N]\prod_{i=1}^{n}(1+\varepsilon_i)$$

where $Vout_{cali}$ is the calibrated digital output signal, $D_i$ (i=1, 2, . . . , N) is the product of the actual output code of the stage i and a corresponding ideal weight, N is the number of stages of the pipelined conversion stages of the pipelined analog-to-digital converter, n is the number of stages of the pipelined conversion stages whose equivalent gain errors required calibration, and $\varepsilon_i$ is the equivalent gain error of the stage i of the pipelined conversion stages.

In Step 3, Step 4 and Step 6, the extraction and calibration of the equivalent gain error are all done by digital methods, and therefore the accuracy of the extraction and calibration of the equivalent gain error is high, which further improves the accuracy of analog-to-digital conversion.

In summary, the analog-to-digital conversion technology proposed by the present disclosure introduces an error calibration mechanism and improves upon traditional pipelined analog-to-digital converters through the control module, the equivalent gain error extraction module, the error storage module and the coding reconstruction module, which compensates for the gain errors and setup errors caused by the operational amplifiers in the pipelined conversion module and improves the accuracy of analog-to-digital conversion, and requirements for the gain and bandwidth of the operational amplifier are relaxed, which can effectively reduce the power consumption of the analog-to-digital converter and the complexity of the corresponding analog circuit;

the pipelined analog-to-digital converter adopts a curve fitting method to obtain the ideal output sequence and then calculate errors, which can smooth out the effect of noise and has higher tolerance to noise; meanwhile, the extraction and calibration of equivalent gain errors are all done in digital ways, and therefore accuracy thereof is high, which further improves the accuracy of analog-to-digital conversion of the converter.

The above-mentioned embodiments only exemplarily illustrate the principles and effects of the present disclosure, but are not used to limit the present disclosure.

Any person skilled in the art may modify or change the above embodiments without violating the spirit and scope of the present disclosure.

Therefore, all equivalent modifications or changes made by those skilled in the art without departing from the spirit and technical concepts disclosed by the present disclosure should still be covered by the attached claims of the present disclosure.

What is claimed is:

1. A pipelined analog-to-digital converter, comprising: a pipelined conversion module, a control module, an equivalent gain error extraction module, an error storage module, and a coding reconstruction module;

wherein the pipelined conversion module comprises a plurality of pipelined conversion stages, the last stage of the plurality of pipelined conversion stages comprises a flash analog-to-digital converter, and each of the remaining stages of the plurality of pipelined conversion stages comprises a flash analog-to-digital converter and a multiplicative digital-to-analog converter;

wherein in a test mode, the control module selectively configures the plurality of pipelined conversion stages in the pipelined conversion module to obtain an analog-to-digital converted test output sequence, the equivalent gain error extraction module fits the test output sequence to obtain an ideal reference signal, calculates equivalent gain errors from the last stage to the first stage of the plurality of pipelined conversion stages according to a difference between the test output sequence and the ideal reference signal, and stores the calculated equivalent gain errors in the error storage module, wherein each of the equivalent gain errors corresponds to a stage of the plurality of pipelined conversion stages;

wherein in an operation mode, the coding reconstruction module calculates calibrated output based on an actual output sequence of the pipelined conversion module and the equivalent gain errors stored in the error storage module, wherein in the test mode, the control module, when selectively configuring the plurality of pipelined conversion stages in the pipelined conversion module, first determines the number of stages whose equivalent gain errors require calibration, and then correspondingly set a threshold value for each comparator in each stage of the plurality of pipelined conversion stages in the test mode, wherein each equivalent gain error includes a gain error and a setup error.

2. The pipelined analog-to-digital converter according to claim 1, wherein each flash analog-to-digital converter comprises a plurality of comparators connected in parallel, by means of which an input analog signal is quantized and converted into a digital signal to obtain a corresponding output code; in stages other than the last stage, a corresponding multiplicative digital-to-analog converter first performs digital-to-analog conversion of the output code to obtain a corresponding converted analog signal, and calculates and amplifies a difference between the input analog signal and the converted analog signal to obtain a residual, wherein the residual serves as an input analog signal for a next stage.

3. The pipelined analog-to-digital converter according to claim 1, wherein each multiplicative digital-to-analog converter comprises an operational amplifier, wherein at least one of the operational amplifiers in the pipelined conversion module has a gain or bandwidth lower than that of the other operational amplifiers.

4. The pipelined analog-to-digital converter according to claim 1, wherein when calculating the equivalent gain error of a stage i of the pipelined conversion stages, absolute values of threshold values for comparators in stages 1, 2, ..., and i−1 of the pipelined conversion stages are greater than or equal to $Fs/(2G)$, wherein Fs is a full amplitude range of an input analog signal corresponding to the stage i, and G is a inter-stage gain of the pipelined conversion stages.

5. A method for output calibration of a pipelined analog-to-digital converter, comprising:

determining the number of stages whose equivalent gain errors require calibration, wherein the stages are chosen from a plurality of pipelined conversion stages in the pipelined analog-to-digital converter, wherein each stage has a corresponding equivalent gain error, and each equivalent gain error includes a gain error and a setup error; and setting a comparator interval for each stage of the plurality of pipelined conversion stages;

inputting a test analog signal to the pipelined analog-to-digital converter to obtain a test output sequence;

fitting the test output sequence to obtain a fitted curve as an ideal output sequence;

calculating the equivalent gain error of each stage of the pipelined conversion stages based on the test output sequence and the ideal output sequence;

inputting an actual analog signal to the pipelined analog-to-digital converter to obtain an actual output sequence; and performing coding reconstruction based on the actual output sequence and the equivalent gain error of each stage of the pipelined conversion stages to obtain a calibrated output, wherein when calculating the equivalent gain error of a stage i of the pipelined conversion stages, absolute values of threshold values for comparators in stages 1, 2, ..., and i−1 of the pipelined conversion stages are greater than or equal to $Fs/(2G)$, wherein Fs is a full amplitude range of an input analog signal corresponding to the stage i, and G is a inter-staqe gain of the pipelined conversion stages.

6. The output calibration method of the pipelined analog-to-digital converter according to claim 5, wherein there is a plurality of operational amplifiers in the pipelined analog-to-digital converter, and at least one of the operational amplifiers has a gain or bandwidth lower than that of the other operational amplifiers.

7. The output calibration method of the pipelined analog-to-digital converter according to claim 6, wherein when calculating the equivalent gain error of a stage i of the pipelined conversion stages, the test analog signal is a signal with pre-recorded characteristics, whose amplitude is close to but does not exceed $Fs/[G^{(i-1)}]$, wherein $Fs=(Vref+)-(Vref-)$, wherein Vref+ is a first reference voltage of multiplicative digital-to-analog converters in the pipelined conversion stages, and Vref- is a second reference voltage of the multiplicative digital-to-analog converters in the pipelined conversion stages.

8. The output calibration method of the pipelined analog-to-digital converter according to claim 5, wherein the test analog signal has at least one monotonically varying interval, a width of the interval is greater than or equal to $Fs/G$, wherein Fs is a full amplitude range of the test analog signal and G is an inter-stage gain of the pipelined conversion stages.

9. The output calibration method of the pipelined analog-to-digital converter according to claim 5 or 7, further comprising performing curve fitting on the test output sequence based on the characteristics of the test analog signal to obtain the fitted curve.

10. The output calibration method of the pipelined analog-to-digital converter according to claim 5, wherein the step of calculating the equivalent gain error of each stage of the pipelined conversion stages based on the test output sequence and the ideal output sequence comprises:

subtracting the corresponding ideal output sequence from the test output sequence to obtain an error sequence;

from higher stages to lower stages, and starting from the last stage of the pipelined conversion stages that requires calibration, sequentially calculating and extracting the equivalent gain error of each stage.

11. The output calibration method of pipelined analog-to-digital converter according to claim 10, wherein the error sequence is segmented according to the comparator interval of the pipelined conversion stages, and when calculating the equivalent gain error of the stage i of the pipelined conversion stages, a plurality of segments of the error sequence is first chosen, then an equivalent gain error of each of the segments is extracted first, and then the equivalent gain errors of the plurality of segments of the error sequence are averaged to obtain the equivalent gain error of the stage i of the pipelined conversion stages, wherein i=1, 2, ..., n, and n is the number of stages in the pipelined conversion stages whose equivalent gain errors require calibration, and n is a positive integer.

12. The output calibration method of the pipelined analog-to-digital converter according to claim 11, wherein the equivalent gain error of each segment of the error sequence is given by:

$$\varepsilon_{i\_j} = \frac{\text{Max}(Err_{i\_j}) - \text{Min}(Err_{i\_j})}{Vthcomp}$$

$$\varepsilon_i = \frac{1}{k}\sum_{j=1}^{k}\varepsilon_{i\_j}$$

wherein $\varepsilon_{i\_j}$ is the equivalent gain error of a j-th segment of the error sequence in the stage i of the pipelined conversion stages, $\text{Max}(Err_{i\_j})$ is the maximum value of the j-th segment of the error sequence of the stage i of the pipelined conversion stages, $\text{Min}(Err_{i\_j})$ is the minimum value of the j-th segment of the error sequence of the stage i of the pipelined conversion stages, Vthcomp is a width of the comparator interval corresponding to the chosen segments of the error sequence of the stage i of the pipelined conversion stages, which is equal to a difference between threshold voltages of two adjacent comparators in the stage i of the pipelined conversion stages.

13. The output calibration method of the pipelined analog-to-digital converter according to claim 7 or 12, wherein an equation utilized for coding reconstruction based on the actual output sequence and the equivalent gain error of each stage of the pipelined conversion stages is given by:

$$Vout_{cali} = D_1 + D_2(1+\varepsilon_1) + D_3\prod_{i=1}^{2}(1+\varepsilon_i) + $$
$$\ldots + D_n\prod_{i=1}^{n-1}(1+\varepsilon_i) + [D_{n+1} + D_{n+2} + \ldots + D_N]\prod_{i=1}^{n}(1+\varepsilon_i)$$

wherein $Vout_{cali}$ is the calibrated digital output signal, $D_i$ (i=1, 2, ..., N) is the product of the actual output code of the stage i and a corresponding ideal weight, N is the number of stages of the pipelined conversion stages of the pipelined analog-to-digital converter, n is the number of stages of the pipelined conversion stages whose equivalent gain errors require calibration, and $\varepsilon_i$ is the equivalent gain error of the stage i of the pipelined conversion stages.

* * * * *